United States Patent
Mohammad

(10) Patent No.: US 7,093,166 B2
(45) Date of Patent: Aug. 15, 2006

(54) METHOD AND APPARATUS FOR TESTING PHYSICAL MEMORY IN AN INFORMATION HANDLING SYSTEM UNDER CONVENTIONAL OPERATING SYSTEMS

(75) Inventor: Rais A. Mohammad, Pflugerville, TX (US)

(73) Assignee: Dell Products L.P., Round Rock, TX (US)

( * ) Notice: Subject to any disclaimer, the term of this patent is extended or adjusted under 35 U.S.C. 154(b) by 566 days.

(21) Appl. No.: 10/266,346

(22) Filed: Oct. 8, 2002

(65) Prior Publication Data
US 2004/0068680 A1    Apr. 8, 2004

(51) Int. Cl.
*G06F 11/00* (2006.01)
(52) U.S. Cl. .............................. 714/42; 714/5; 714/718
(58) Field of Classification Search .................. 714/29, 714/42, 718, 5, 25, 47
See application file for complete search history.

(56) References Cited

U.S. PATENT DOCUMENTS

| | | | | |
|---|---|---|---|---|
| 5,664,092 | A | * | 9/1997 | Waites .......................... 714/25 |
| 5,673,388 | A | * | 9/1997 | Murthi et al. .................. 714/42 |
| 5,768,585 | A | * | 6/1998 | Tetrick et al. .................. 713/2 |
| 5,881,221 | A | * | 3/1999 | Hoang et al. ................... 714/42 |
| 6,021,261 | A | * | 2/2000 | Barrett et al. .................. 714/37 |
| 6,028,999 | A | | 2/2000 | Pazel |
| 6,279,109 | B1 | | 8/2001 | Brundridge |
| 6,330,696 | B1 | | 12/2001 | Zorian et al. |
| 6,360,220 | B1 | * | 3/2002 | Forin ............................. 707/8 |
| 6,378,066 | B1 | * | 4/2002 | Lewis ........................ 712/236 |
| 6,477,612 | B1 | * | 11/2002 | Wang ............................. 711/2 |
| 6,671,645 | B1 | * | 12/2003 | Maxham ..................... 702/117 |
| 6,742,148 | B1 | * | 5/2004 | Korhonen ................... 714/718 |
| 6,889,159 | B1 | * | 5/2005 | Klotz et al. ................. 702/122 |
| 2004/0015864 | A1 | * | 1/2004 | Boucher ..................... 717/124 |

* cited by examiner

*Primary Examiner*—Scott Baderman
*Assistant Examiner*—Paul Contino
(74) *Attorney, Agent, or Firm*—Haynes and Boone, LLP

(57) ABSTRACT

An information handling system includes at least one microprocessor, a physical memory coupled to the at least one microprocessor, and a physical memory testing subsystem. The physical memory is configured to store an operating system. The physical memory testing subsystem is configured for a) querying the operating system for the size of the physical memory and a number of microprocessors, b) in response to the number of microprocessors, creating memory tester threads equal in number to the number of microprocessors, c) in response to the size of the physical memory, allocating memory chunks of a virtual memory to be on the order of the size of the physical memory, d) dividing the allocated memory chunks equally among the memory tester threads, e) creating a scanner thread, and f) executing the memory tester threads and scanner thread, wherein the scanner thread is configured to increase the probability of maintaining the allocated memory in physical memory for a duration of physical memory testing by the memory tester threads.

30 Claims, 3 Drawing Sheets

METHOD AND APPARATUS FOR TESTING PHYSICAL MEMORY IN AN INFORMATION HANDLING SYSTEM UNDER CONVENTIONAL OPERATING SYSTEMS

BACKGROUND

The present disclosure relates generally to information handling systems, and more particularly to a method and apparatus for testing physical memory in an information handling system under conventional operating systems.

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

In conjunction with information handling systems, one known memory test algorithm employs a four-step process. The process first finds out the size of the physical memory, allocates memory space equal to the size of the physical memory, writes a pattern into the allocated memory space, and then verifies the pattern. During verification, an error is called out if there is a mismatch between the pattern written into the allocated memory space and that read from the same.

Testing physical memory of an information handling system as an application while running under an Operating System (OS) is a challenge. This is because the OS memory manager is managing the physical memory. In a typical information handling system, an application has access to virtual memory pages that are in turn mapped to physical memory pages by the memory manager. The set of virtual pages that a process is currently using is called its working set. While an application is active, the memory manager monitors the application's working set and the virtual memory pages that are not being utilized while a number of "n" consecutive clock ticks are being swapped out to disk. This causes a problem when performing a memory test because the process of swapping pages decreases the probability of testing all of the physical memory.

Accordingly, it would be desirable to provide method for testing physical memory absent the disadvantages found in the prior methods discussed above.

SUMMARY

According to one embodiment, an information handling system includes at least one microprocessor, a physical memory coupled to the at least one microprocessor, and a physical memory testing subsystem. The physical memory is configured to store an operating system. The physical memory testing subsystem is configured for a) querying the operating system for the size of the physical memory and a number of microprocessors, b) in response to the number of microprocessors, creating memory tester threads equal in number to the number of microprocessors, c) in response to the size of the physical memory, allocating memory chunks of a virtual memory to be on the order of the size of the physical memory, d) dividing the allocated memory chunks equally among the memory tester threads, e) creating a scanner thread, and f) executing the memory tester threads and scanner thread, wherein the scanner thread is configured to increase the probability of maintaining the allocated memory in physical memory for a duration of physical memory testing by the memory tester threads.

DETAILED DESCRIPTION

According to one embodiment of the present disclosure, a method and system are disclosed for testing physical memory in an information handling system. The method and system can be better understood by reference to the flow charts, drawing figures, and additional discussion included herein.

Figure 1:
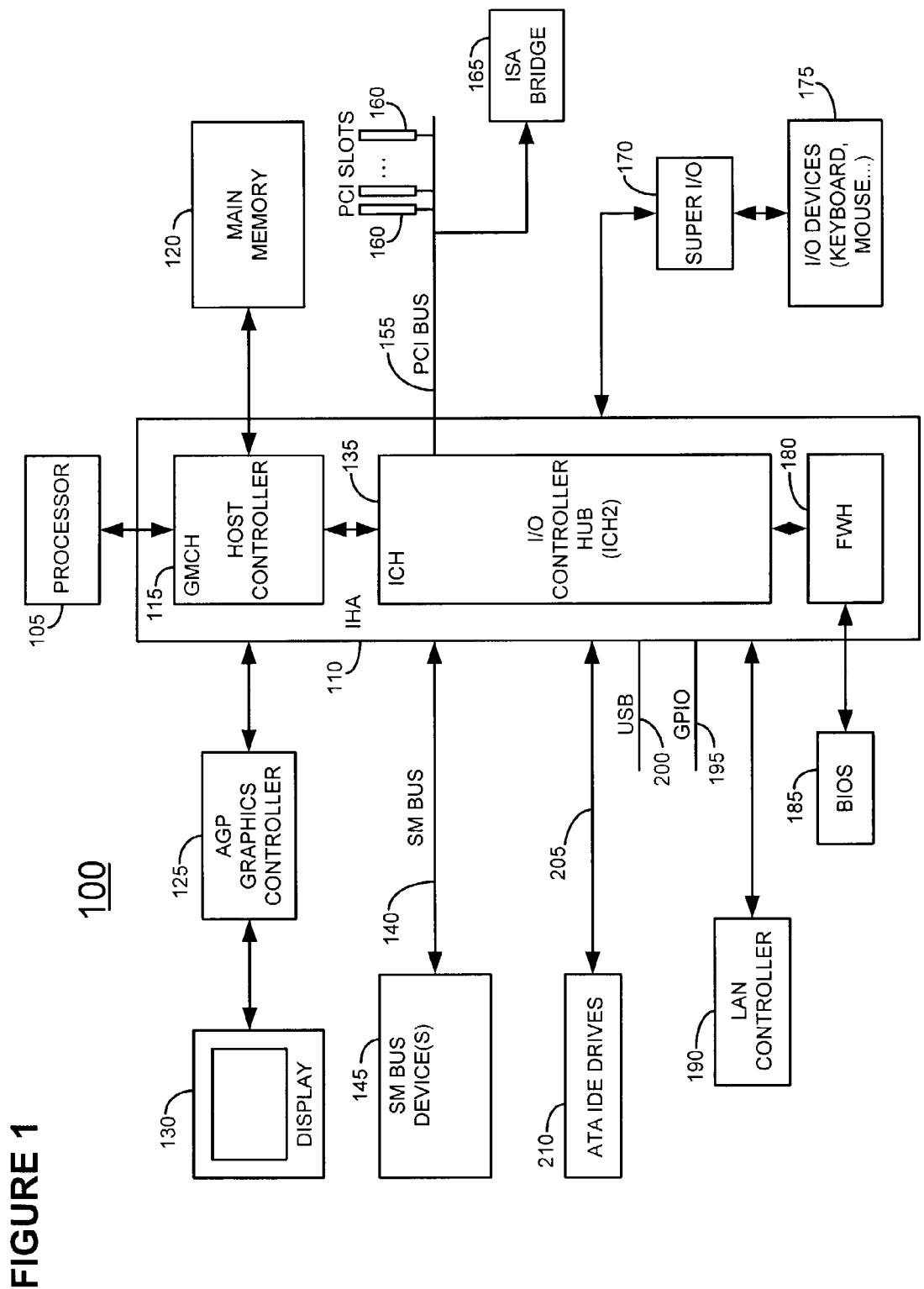
FIG. 1 illustrates a block diagram view of an information handling system having a method and apparatus for testing physical memory under an operating system according to an embodiment of the present disclosure.

FIG. 1 depicts a high level block diagram of an information handling system 100 in which the disclosed technology is practiced. For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

The particular information handling system 100 depicted in FIG. 1 is a portable computer which includes a processor 105. An Intel Hub Architecture (IHA) chip 110 provides system 100 with memory and I/O functions. More particularly, IHA chip 110 includes a Graphics and AGP Memory Controller Hub (GMCH) 115. GMCH 115 acts as a host controller that communicates with processor 105 and further acts as a controller for main memory 120. GMCH 115 also provides an interface to Advanced Graphics Port (AGP) controller 125 which is coupled thereto. A display 130 is coupled to AGP controller 125. IHA chip 110 further includes an I/O Controller Hub (ICH) 135 which performs numerous I/O functions. ICH 135 is coupled to a System Management Bus (SM Bus) 140 which is coupled to one or more SM Bus devices 145.

ICH 135 is coupled to a Peripheral Component Interconnect (PCI) bus 155 which is coupled to mini PCI connector slots 160 which provide expansion capability to portable computer 100. A super I/O controller 170 is coupled to ICH 135 to provide connectivity to input devices such as a keyboard and mouse 175 as shown in FIG. 1. A firmware hub (FWH) 180 is coupled to ICH 135 to provide an interface is to system BIOS 185 which is coupled to FWH 180. A General Purpose I/O (GPIO) bus 195 is coupled to ICH 135. USB ports 200 are coupled to ICH 135 as shown. USB devices such as printers, scanners, joysticks, etc. can be added to the system configuration on this bus. An integrated drive electronics (IDE) bus 205 is coupled to ICH 135 to connect IDE drives 210 to the computer system.

Figure 2:
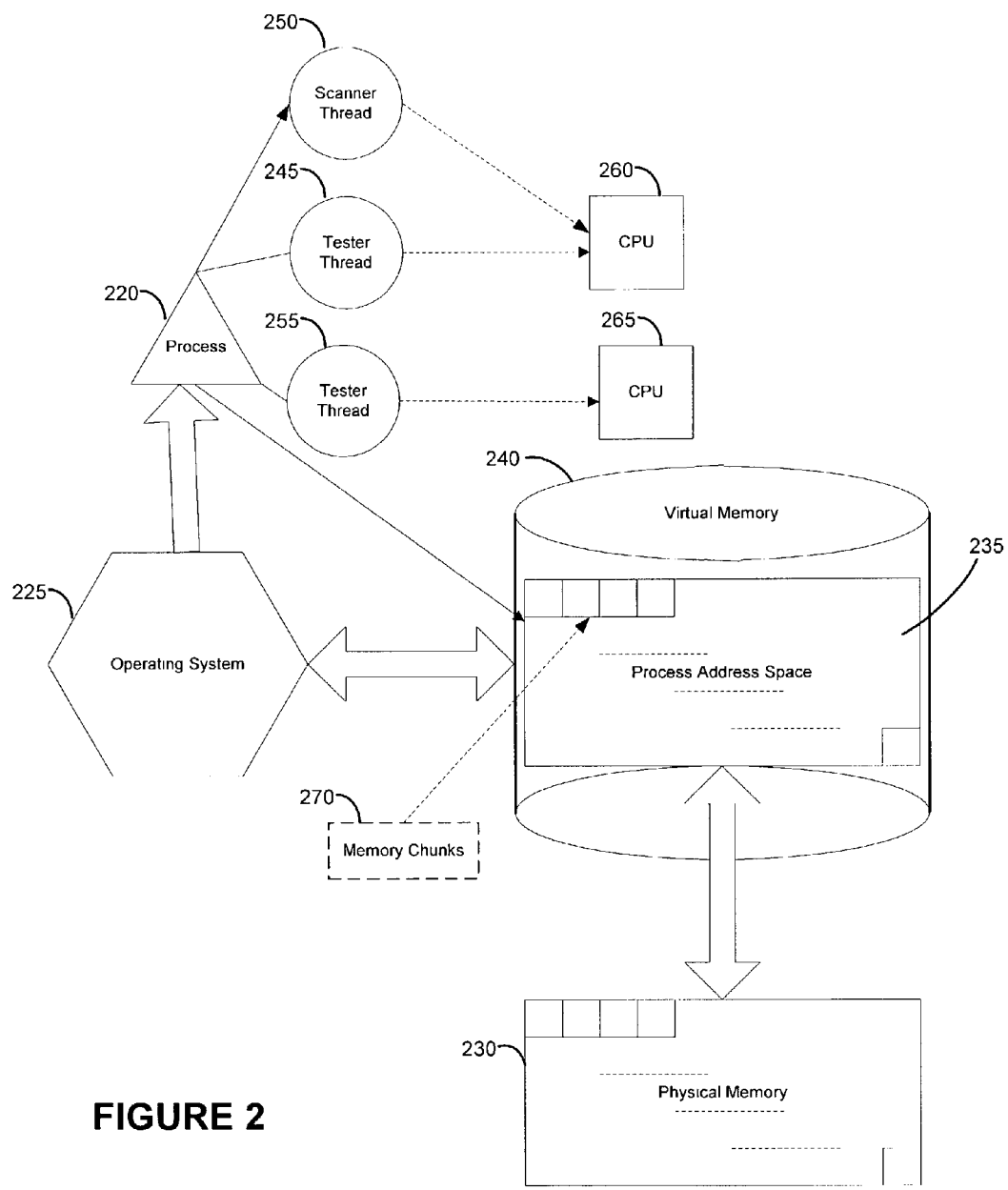
FIG. 2 illustrates a diagrammatic view of a portion of the information handling system utilizing physical memory testing under an operating system according to an embodiment of the present disclosure.

Referring now to FIG. 2, according to one embodiment of the present disclosure, a process 220 for testing physical memory 225 of an information handling system having an operating system (OS) 230 is configured to increase the probability of keeping allocated memory 235 in virtual memory 240 for a duration of the memory test. In other words, the method for testing memory, forces the size of its respective working set of the memory testing process to be as close to the size of the physical memory 230 as possible, during the overall time of the memory testing.

The process 220 for testing physical memory utilizes a multithreaded feature of the OS 225. Using the multithread feature of the OS, the method forces the size of a working set 235 to be as close to the size of the physical memory 230 as possible, during a duration of the physical memory testing. Recall that a working set is a set of virtual pages in current use by the process, corresponding to a process address space.

More particularly, according to one embodiment, the method includes a memory test configured to have at least two threads. A first thread 245 performs an actual memory test algorithm, while the other thread 250 is dedicated to keeping the allocated memory from being swapped out to disk (i.e., physical memory). This second thread 250 utilizes a scan function for keeping the allocated memory from being swapped out to disk during the memory testing by the first thread 245. When there are more than one first thread (245,255), the second thread 250 keeps the allocated memory for each of the first threads (245,250) from being swapped out to disk during the memory testing by respective ones of the first threads (245,250).

According to an embodiment of the present disclosure, the method includes a memory test algorithm which operates as follows. First, the method is configured to find out the size of physical memory 230 in the information handling system. Next, the method determines the number of physical CPUs (260,265) in the information handling system. The algorithm then creates as many testing threads (245,255) as there are CPUs (260,265). These testing threads (245,255) will be responsible for performing a memory write-verify test function. The algorithm also creates one more thread 250 responsible for a memory scan function. The method further allocates virtual memory space 235 equal to the size of physical memory 230, divides the allocated virtual memory among the testing threads (245,255) responsible for a write-verify test function, and executes all threads (245,250,255) at the same time to perform their respective functions. Accordingly, the tester thread(s) (245,255) and the scanner thread (250) are run simultaneously. In addition, allocation of the virtual memory can be accomplished via memory chunks 270 having a prescribed chunk size. For example, an arbitrary chunk size may include a one (1) Mega byte (MB) allocation.

Figure 3:
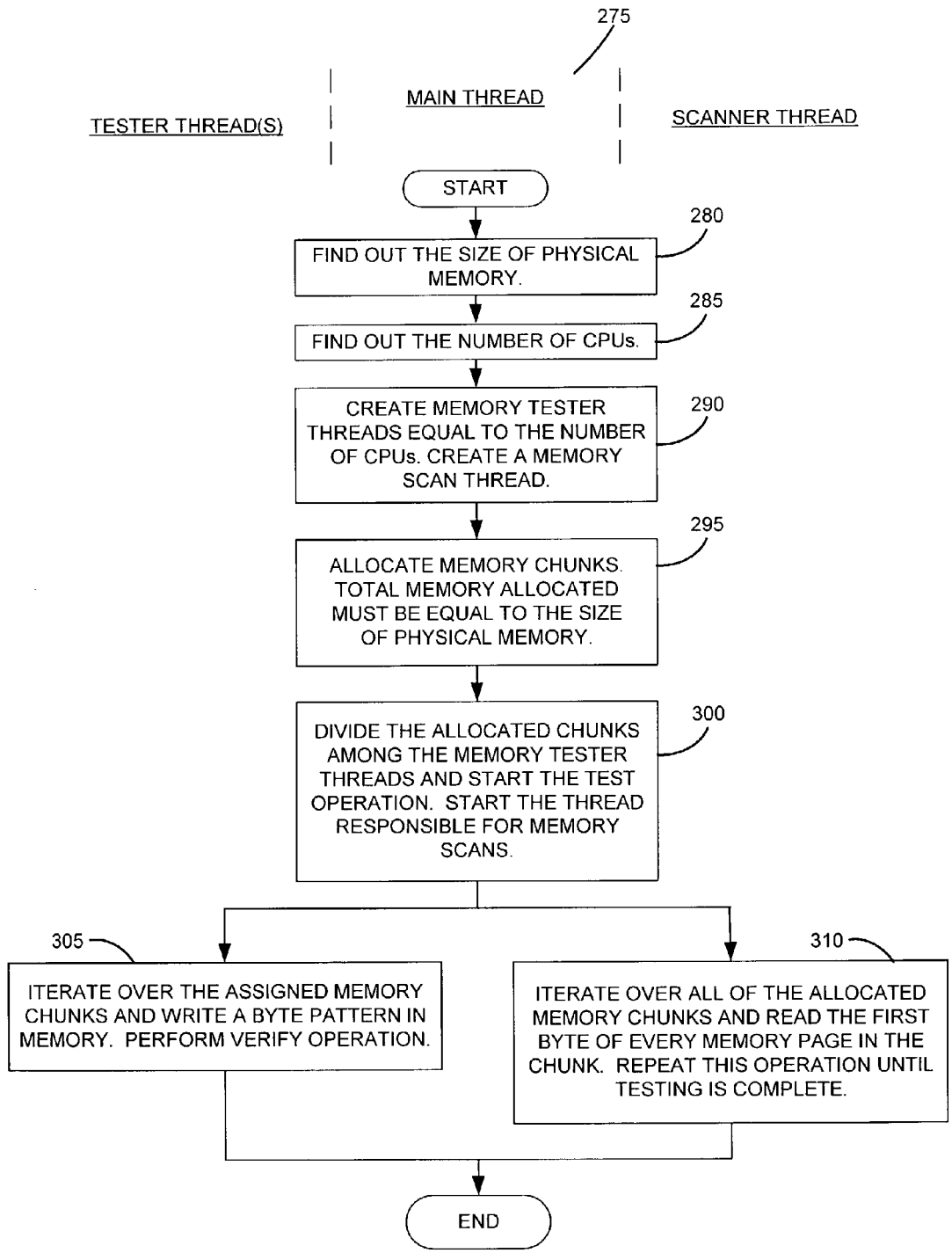
FIG. 3 shows a flow chart for a physical memory testing method according to one embodiment of the present disclosure.

According to another embodiment, in conjunction with the flow diagram of FIG. 3 as indicated by reference numeral 275, a method for performing memory diagnostics includes the following:

1. Find out the size of physical memory (as indicated by reference numeral 280 in FIG. 3). The size of physical memory can be determined, for example, using the following API on a MICROSOFT(™) WINDOWS(™) OS to retrieve the MEMORYSTATUS stat.

. . .

GlobalMemoryStatus (&stat);

int total_bytes_of_physical_memory=stat.dwTotalPhys;

. . .

2. Find out the number of CPUs (as indicated by reference numeral 285 in FIG. 3). The number of CPUs can be determined, for example, using the following API on the Microsoft Windows OS. This API is configured to retrieve the current number of CPUs from the system registry.

```
. . .
HKEY hKey = NULL;
ustring * pstrNumCPUS = (ustring *)malloc (512);
u32 bufferSize = 512;
RegOpenKeyEx (HKEY_LOCAL_MACHINE,
L"SYSTEM\\CurrentControlSet\\Control\\Session
Manager\\Environment",0,KEY_QUERY_VALUE,&hKey)
RegQueryValueEx (hKey, L"NUMBER_OF_PROCESSORS",
NULL,NULL,(unsigned char*)pstrNumCPUS,&bufferSize)
. . .
```

3. Create memory tester and scan threads (as indicated by reference numeral 290 in FIG. 3). Memory tester and scan threads can be created, for example, using the following API on the Microsoft Windows OS. This API is configured to start the respective threads:

```
. . .
DWORD hMemTestThreadId;
m_hStartMemTestThread = CreateThread(NULL, 0,
StartMemoryTestThreadFunc,
this, 0, & hMemTestThreadId);
. . .
```

In this step of creating memory tester and scan threads, if the information handling system contained two (2) CPUs, then the method creates two tester and one scanner thread (a total of three).

4. Allocate memory chunks (as indicated by reference numeral 295 in FIG. 3). Total memory (i.e., virtual memory) allocated must be equal to the size of physical memory. For example, an arbitrary chunk size of one (1) MB can be used during the allocation step. Accordingly, the virtual memory allocation function is configured to allocate as many chunks as there are in physical memory in MBs.

5. Divide the allocated chunks among the memory tester threads and start the test operation, in addition to starting the thread responsible for memory scans (as indicated by reference numeral 300 in FIG. 3). For example, if there were 128 MBs of physical memory and 2 CPUs in the information handling system, then the allocation step would allocate 128 chunks of virtual memory and assign 64 chunks to each of the tester threads.

6. Iterate over the assigned memory chunks, write a byte pattern in respective memory chunks, and perform a respective verify operation (as indicated by reference numeral 305 in FIG. 3). In this step, each tester thread is configured to write a byte pattern (e.g. "A5" in each byte of the 1 MB chunk) and then read it back and compare the value to "A5". If all bytes in the chunk are equal, then the verify function passes the test for the respective memory chunk and the memory chunk is determined in good order. If the bytes in the chunk are unequal, then the verify function does not pass the test for the respective memory chunk.

7. Iterate over all of the allocated memory chunks and read the first byte of every memory page in the chunk. Repeat this operation until testing is complete (as indicated by reference numeral 310 in FIG. 3). While the tester threads are performing the test operations, the scanner thread iterates over the 128 chunks and reads the first byte of each Page in the 1 MB chunk. The scanner thread keeps repeating this step until the tester threads complete their test process. Accordingly, the allocated memory is kept from being swapped out to disk by the scanner thread during a testing of the physical memory by the tester threads.

Although only a few exemplary embodiments have been described in detail above, those skilled in the art will readily appreciate that many modifications are possible in the exemplary embodiments without materially departing from the novel teachings and advantages of the embodiments of the present disclosure. Accordingly, all such modifications are intended to be included within the scope of the embodiments of the present disclosure as defined in the following claims. In the claims, means-plus-function clauses are intended to cover the structures described herein as performing the recited function and not only structural equivalents, but also equivalent structures.

What is claimed is:

1. An information handling system comprising:
   at least one microprocessor;
   a physical memory coupled to said at least one microprocessor, said physical memory configured to store an operating system; and
   a physical memory testing subsystem configured for a) querying the operating system for the size of said physical memory and a number of microprocessors, b) in response to the number of microprocessors, creating memory tester threads equal in number to the number of microprocessors, c) in response to the size of said physical memory, allocating memory chunks of a virtual memory to be equal to the size of said physical memory, d) dividing the allocated memory chunks equally among the memory tester threads, e) creating a scanner thread, and f) executing the memory tester threads and scanner thread, wherein a memory tester thread performs an actual memory test algorithm, and wherein the scanner thread is configured to maintain the allocated memory in physical memory for a duration of physical memory testing by the memory tester threads.

2. The information handling system of claim 1, wherein querying the operating system includes using an API.

3. The information handling system of claim 1, wherein allocating memory chunks of the virtual memory includes configuring the virtual memory to be equal in size to the physical memory.

4. The information handling system of claim 1, wherein the information handling system includes two microprocessors, and further wherein creating memory tester threads includes using an API configured to create two memory tester threads.

5. The information handling system of claim 1, wherein said physical memory testing subsystem is further configured for iterating over all of the allocated memory chunks with the scanner thread, and repeating the iterating until testing by the memory tester threads is complete.

6. The information handling system of claim 1, wherein the memory tester threads are configured to write a pattern into a memory chunk and perform a verify operation, wherein the verify operation includes reading the pattern back from the memory chunk and comparing the read pattern with the original pattern.

7. The information handling system of claim 1, wherein said physical memory testing subsystem is further configured for iterating over all of the allocated memory chunks with the scanner thread, reading a first byte of every memory page in the chunk, and repeating the iterating of the scanner thread until a completion of testing by the tester threads.

8. The information handling system of claim 7, wherein said physical memory testing subsystem is further configured for iterating over the assigned memory chunks with a memory tester thread, writing a byte pattern into a respective memory chunk, and performing a verify operation.

9. The information handling system of claim 1, wherein said physical memory testing subsystem is further configured for iterating over the assigned memory chunks with a memory tester thread, writing a byte pattern into a respective memory chunk, and performing a verify operation.

10. The information handling system of claim 1, wherein said physical memory testing subsystem is further configured for iterating over all of the allocated memory chunks with the scanner thread, and repeating the iterating until testing by the memory tester threads is complete, wherein the memory tester threads are configured to write a pattern into a memory chunk and perform a verify operation, wherein the verify operation includes reading the pattern back from the memory chunk and comparing the read pattern with the original pattern.

11. A method for implementing physical memory testing in an information handling system having an operating system, the method comprising:
   querying the operating system for the size of a physical memory and a number of CPUs;
   in response to the number of CPUs, creating memory tester threads equal in number to the number of CPUs;
   in response to the size of the physical memory, allocating memory chunks of a virtual memory to be equal to the size of the physical memory;
   dividing the allocated memory chunks equally among the memory tester threads;
   creating a scanner thread; and
   executing the memory tester threads and scanner thread, wherein a memory tester thread performs an actual memory test algorithm, and wherein the scanner thread is configured to maintain the allocated memory in physical memory for a duration of physical memory testing by the memory tester threads.

12. The method of claim 11, wherein querying the operating system includes using an API.

13. The method of claim 11, wherein allocating memory chunks of the virtual memory includes configuring the virtual memory to be equal in size to the physical memory.

14. The method of claim 11, wherein the information handling system includes two CPUs, and further wherein creating memory tester threads includes using an API configured to create two memory tester threads.

15. The method of claim 11, further comprising iterating over all of the allocated memory chunks with the scanner thread, and repeating the iterating until testing by the memory tester threads is complete.

16. The method of claim 11, wherein the memory tester threads are configured to write a pattern into a memory chunk and perform a verify operation, wherein the verify operation includes reading the pattern back from the memory chunk and comparing the read pattern with the original pattern.

17. The method of claim 11, further comprising:
with the scanner thread, iterating over all of the allocated memory chunks, reading a first byte of every memory page in the chunk, and repeating the iterating of the scanner thread until a completion of testing by the tester threads.

18. The method of claim 17, further comprising:
with each memory tester thread, iterating over the assigned memory chunks, writing a byte pattern into a respective memory chunk, and performing a verify operation.

19. The method of claim 11, further comprising:
with each memory tester thread, iterating over the assigned memory chunks, writing a byte pattern into a respective memory chunk, and performing a verify operation.

20. The method of claim 11, further comprising:
iterating over all of the allocated memory chunks with the scanner thread, and repeating the iterating until testing by the memory tester threads is complete, wherein the memory tester threads are configured to write a pattern into a memory chunk and perform a verify operation, wherein the verify operation includes reading the pattern back from the memory chunk and comparing the read pattern with the original pattern.

21. A computer program for implementing physical memory testing, the computer program processable by an information handling system for causing the information handling system to:
query an operating system of the information handling system for the size of a physical memory and a number of CPUs;
create, in response to the number of CPUs, memory tester threads equal in number to the number of CPUs;
allocate, in response to the size of the physical memory, memory chunks of a virtual memory to be equal to the size of the physical memory;
divide the allocated memory chunks equally among the memory tester threads;
create a scanner thread; and
execute the memory tester threads and scanner thread, wherein a memory tester thread performs an actual memory test algorithm, and wherein the scanner thread is configured to maintain the allocated memory in physical memory for a duration of physical memory testing by the memory tester threads.

22. The computer program of claim 21, wherein querying the operating system includes using an API.

23. The computer program of claim 21, wherein allocating memory chunks of the virtual memory includes configuring the virtual memory to be equal in size to the physical memory.

24. The computer program of claim 21, further processable by the information handling system for causing the information handling system to:
iterate over all of the allocated memory chunks with the scanner thread, and repeat the iterating until testing by the memory tester threads is complete.

25. The computer program of claim 21, wherein the memory tester threads are configured to write a pattern into a memory chunk and perform a verify operation, wherein the verify operation includes reading the pattern back from the memory chunk and comparing the read pattern with the original pattern.

26. The computer program of claim 21, further processable by the information handling system for causing the information handling system to:
iterate over all of the allocated memory chunks with the scanner thread, a reading of a first byte of every memory page in the chunk, and repeating the iterating of the scanner thread until a completion of testing by the tester threads.

27. The computer program of claim 26, further processable by the information handling system for causing the information handling system to:
iterate over the assigned memory chunks with each memory tester thread, a writing of a byte pattern into a respective memory chunk, and performing a verify operation.

28. The computer program of claim 21, further processable by the information handling system for causing the information handling system to:
iterate over the assigned memory chunks with each memory tester thread, a writing of a byte pattern into a respective memory chunk, and performing a verify operation.

29. The computer program of claim 21, further processable by the information handling system for causing the information handling system to:
iterate over all of the allocated memory chunks with the scanner thread, and repeat the iterating until testing by the memory tester threads is complete, wherein the memory tester threads are configured to write a pattern into a memory chunk and perform a verify operation, wherein the verify operation includes reading the pattern back from the memory chunk and comparing the read pattern with the original pattern.

30. An information handling system comprising:
at least one microprocessor;
a physical memory coupled to each microprocessor and configured to store an operating system; a physical memory testing subsystem including:
means for querying the operating system for the size of the physical memory and the number of microprocessors;
means for creating memory tester threads equal in number to the number of microprocessors;
means for allocating memory chunks of a virtual memory equal to the size of the physical memory;
means for dividing the allocated memory chunks equally among the memory tester threads;

a scanner thread; and means for executing the memory tester threads and scanner thread, wherein a memory tester thread is configured to perform an actual memory test algorithm, and wherein the scanner thread is configured to maintain the allocated memory in physical memory for a duration of physical memory testing by the memory tester threads.

* * * * *